(12) United States Patent
Williams et al.

(10) Patent No.: US 10,796,741 B1
(45) Date of Patent: Oct. 6, 2020

(54) NON-VOLATILE MEMORY WITH A SELECT GATE REGULATOR CIRCUIT

(71) Applicant: NXP USA, Inc., Austin, TX (US)

(72) Inventors: Jacob T. Williams, Austin, TX (US);
Jon Scott Choy, Austin, TX (US);
Karthik Ramanan, Austin, TX (US)

(73) Assignee: NXP USA, Inc., Austin, TX (US)

(*) Notice: Subject to any disclaimer, the term of this patent is extended or adjusted under 35 U.S.C. 154(b) by 0 days.

(21) Appl. No.: 16/668,206

(22) Filed: Oct. 30, 2019

(51) Int. Cl.
*G11C 11/16* (2006.01)
*G11C 5/14* (2006.01)

(52) U.S. Cl.
CPC .......... *G11C 11/1657* (2013.01); *G11C 5/145* (2013.01); *G11C 11/1675* (2013.01); *G11C 11/1697* (2013.01)

(58) Field of Classification Search
CPC ............ G11C 11/1657; G11C 11/1675; G11C 11/1697; G11C 5/145
USPC ......................................................... 365/158
See application file for complete search history.

(56) References Cited

U.S. PATENT DOCUMENTS

| | | | | |
|---|---|---|---|---|
| 7,760,543 B2* | 7/2010 | Ueda | ...................... | G11C 5/147 365/158 |
| 7,791,930 B2* | 9/2010 | Ueda | ................... | G11C 11/1673 365/148 |
| 8,040,718 B2* | 10/2011 | Ueda | ................... | G11C 11/1659 365/158 |
| 8,625,361 B2* | 1/2014 | Chiu | ....................... | G11C 8/16 365/189.04 |
| 2017/0092347 A1 | 3/2017 | Gogl et al. | | |
| 2019/0051341 A1 | 2/2019 | Li et al. | | |

* cited by examiner

*Primary Examiner* — Fernando Hidalgo

(57) ABSTRACT

A word line regulator provides a write word line voltage for an asserted word line and includes a write replica circuit, a reference current path, and a regulator circuit. The write replica circuit is a replica of a write path for writing from a low to high resistance value of a resistive memory element of a memory cell. The word line regulator regulates the word line voltage at a value during the write operation of a low to high resistance value such that a select transistor of the memory cell is used as a source follower to regulate a first node of a resistive element of the memory cell being written. The first node is at a higher write voltage than a second node of the resistive element during the write operation, and the first node is located in a write path between the select transistor and the second node.

20 Claims, 5 Drawing Sheets

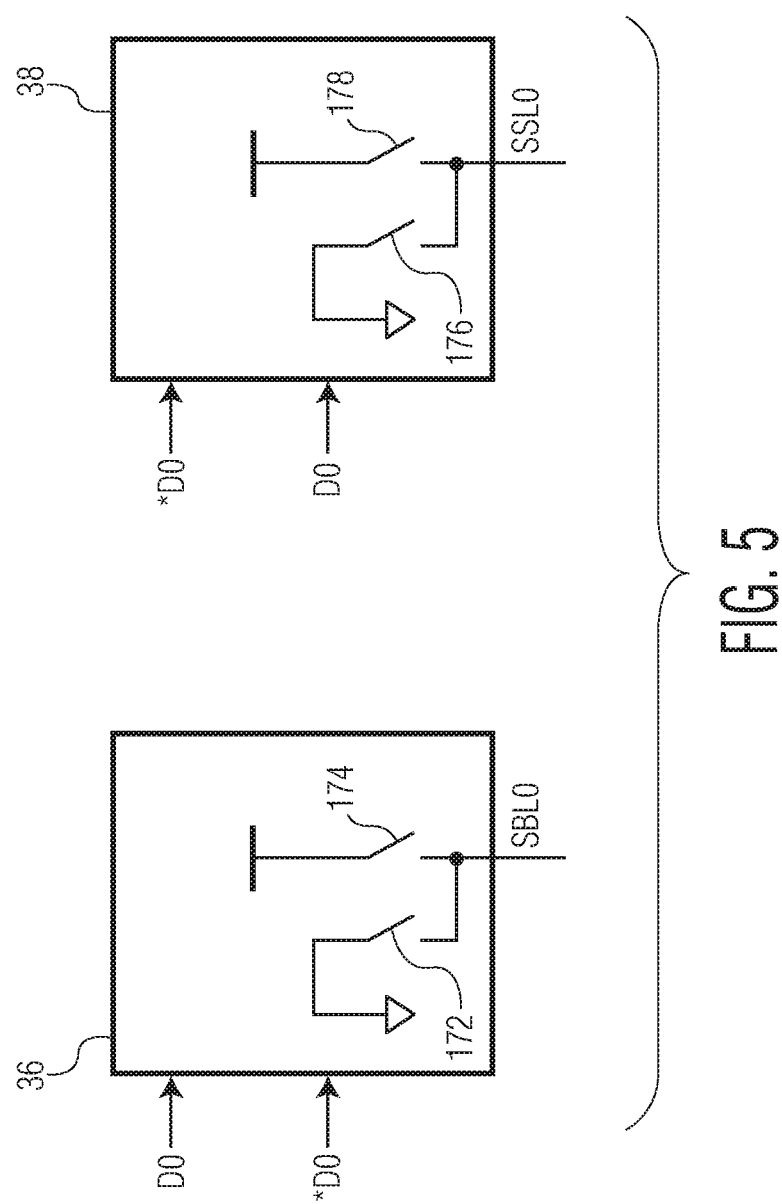

NON-VOLATILE MEMORY WITH A SELECT GATE REGULATOR CIRCUIT

BACKGROUND OF THE INVENTION

Field of the Invention

This invention relates to non-volatile memories.

Background

Non-volatile memories are utilized for storing data in an electronic system including when the systems are powered down, since the bit cells hold their states. One type of non-volatile memory is a resistive memory, in which each bit cell of a resistive memory includes a resistive storage element which is in either a high resistive state (HRS) or a low resistive state (LRS), depending on the logic state of the bit cell. For a write operation of a bit cell of a resistive memory, a write current is provided in a first direction through the resistive storage element to place it in the HRS, and a write current is provided in a second and opposite direction through the resistive storage element to place it in the LRS. It is desirable to optimize these write currents across temperature, process, and voltage variations so as to ensure, for example, that the proper write current is used, which is large enough to be effective to change the resistive state but not so large so as to damage the resistive storage element.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 5 is a circuit diagram of a bit line driver circuit and a source line driver circuit, according to one embodiment of the present invention The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, in a resistive memory, the programming or write current for a LRS to HRS transition of a first set of selected resistive memory cells along a selected word line is optimized by using the corresponding select transistors as source followers to regulate the voltage over each corresponding resistive memory cell of the first set in response to the output of a select gate regulator circuit. A select gate regulator circuit regulates a voltage on the selected word line during a write operation to result in a desired or target voltage over the selected resistive memory cells, which ensures the proper write current through the resistive memory cells for the LRS to HRS transition. In one embodiment, the programming or write current for a HRS to LRS transition of a second set of selected resistive memory cells along the selected word line is simultaneously optimized by using a driver gate regulator circuit which regulates a voltage at the control electrode of the driver transistors of each write path of the second set of selected resistive memory cells. In another embodiment, the select gate regulator circuit, during a different portion of the write operation, also regulates a voltage on the selected word line to ensure the proper write current through selected resistive memory cells along the selected word line which transition from LRS to HRS. As will be described in more detail below, the select gate regulator circuit, and driver gate regulator circuit, if present, ensure that the proper write currents are provided across temperature, process, and voltage variations.

Figure 1:
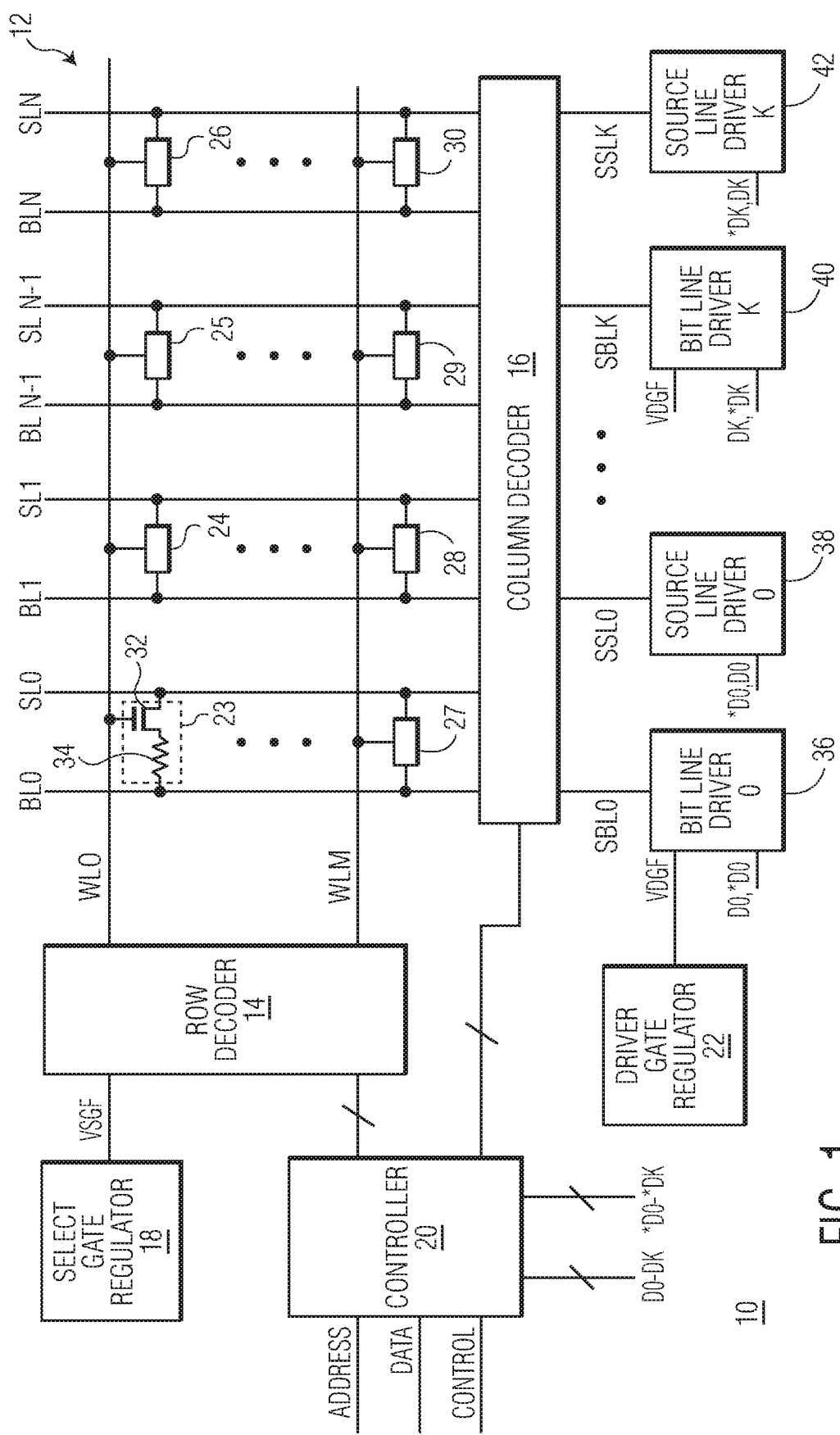
FIG. 1 is a circuit diagram of a non-volatile memory circuit according to one embodiment of the present invention.

FIG. 1 shows a circuit diagram of a non-volatile memory circuit 10 according to one embodiment of the present invention. Memory circuit 10 includes an array 12 of non-volatile memory cells (e.g. 23-30). In one embodiment, the memory cells of array 12 are characterized as resistive memory cells with a select transistor (e.g. 32) and a resistive storage element (e.g. 34). Types of resistive memory cells include MRAM, ReRAM, carbon nanotube, and phase change memory cells. In these resistive memory cells, the resistive storage element (e.g.) may be implemented by a magnetic tunnel junction (MTJ), therefore, each bit cell may be described as including a select transistor (e.g. 32) and an MTJ (e.g. 34). Note that in the illustrated embodiments, the select gate transistors are N-type metal-oxide-semiconductor (NMOS) transistors.

The memory cells of array 12 are arranged in rows and columns. Each cell of a row is coupled to a corresponding word line of WL0-WLM for controlling the select transistor (e.g. 32) of the cell to access the resistive storage element (e.g. 34) of the cell during a memory operation. The word lines are controlled by a row decoder 14 which asserts a selected one of the word lines based on a first portion of an address received by a controller 20 of memory circuit 10 for the memory operation. During a write operation, as will be described in further detail in reference to FIGS. 2 and 4 below, the selected word line is asserted by applying a select gate follower voltage, $V_{SGF}$, to the selected word line, in which $V_{SGF}$ is provided by a select gate regulator 18. Array 12 includes M+1 number of rows with 2 rows being shown in FIG. 1. However, an array may include a different number of rows in other embodiments For example, an 8 Mb memory array may have 2048 rows plus a few (e.g., 2 or 4) redundant rows.

In the embodiment shown, the cells of each column of array 12 are coupled to a corresponding source line of SL0-SLJ and a corresponding bit line of BL0-BLJ. Array 12 includes N+1 source lines and N+1 bit lines, in which FIG. 1 illustrates four source lines (e.g. SL0, SL1, SLN−1, and SLN) and four bit lines (e.g. BL0, BL1, BLN−1, and BLN). However, array 12 may have a different number source lines and bit lines in other embodiments. In other embodiments, an array may include a source line paired with two bit lines or other combinations of bit lines per source line.

In the embodiment shown, memory circuit 10 includes a column decoder 16 for selecting a subset of the bit lines and source lines (SBL0:SBLK, SSL0:SSLK) to provide to write circuitry 48 of memory circuit 10 during a memory write operation. Decoder 16 selects K+1 number of selected bit lines and selected source lines based on a second portion of the address received by controller 20 for the memory operation. In one embodiment, the ratio of J+1 to K+1 is 8 to 1, but may be of other ratios in other embodiments. Some embodiments do not include a column decoder. Note that the read circuitry of memory circuit 10, coupled to the selected bit lines and source lines (SBL0:SBLK, SSL0:SSLK) for outputting corresponding K+1 output data lines during a memory read operation is not illustrated for simplicity. Also, control signals received by controller 20 may include a R/W indicator to indicate whether a write memory operation or a read memory operation is being performed.

The selected source lines and selected bit lines (SSL0: SSLK, SBL0:SBLK) are provided to write circuitry 48 for writing data to addressed cells of array 12 during a memory write operation and provided to read circuitry for reading data from addressed cells during a read operation. Write circuitry 48 includes source line driver 0 circuit through source line driver K circuit (including circuits 38 and 42) for controlling write characteristics (e.g. voltage, current) of the selected source lines (SSL0:SSLK) and bit line driver circuit 0 through bit line driver circuit K (including circuits 36 and 40) for controlling write characteristics of selected bit lines (SBL0:SBLK) during a write operation. Each of the source line drivers and bit line drivers receives a data signal and corresponding complementary data signal (e.g. D0-DK, respectively, and D0*-DK*, respectively) from controller 20 that is based on the DATA received by controller 20 to be written into the addressed memory location.

In one embodiment of a resistive memory array, when current flows through the resistive storage element of a memory cell in a first direction, the memory cell is written to a low resistive state (LRS) in which the magnetic moments of the interacting magnetic layers of the MTJ are aligned in the same direction, and when current flows in a second direction, opposite the first direction, through the resistive storage element, the memory cell is written to a high resistive state (HRS) in which the magnetic moments of the interacting magnetic layers of the MTJ are not aligned in the same direction. In one embodiment, a HRS corresponds to a logic level one and a LRS corresponds to a logic level low. However, in alternate embodiments, the LRS may correspond to the logic level high and the HRS to the logic level low. In one embodiment, the resistance of the HRS is 2-3 times the resistance of the LRS, in which the resistance of the LRS may be in a range of 2k-8k Ohms.

Therefore, referring to write circuitry 48, if the data bit to be written (e.g. D0) is low (i.e. 0) and the complementary data bit to be written (e.g. D0*) is high (i.e. 1), then the source line driver circuit (e.g. source line driver 0 38) receiving the data bit will couple the selected source line (e.g. SSL0) to ground and the bit line driver circuit (e.g. bit line driver 0 36) receiving the complementary data bit will couple the selected bit line (e.g. SBL0) to receive a non-ground write voltage or write current during a write operation to a memory cell of array 12. In this manner, the current will flow in a first direction (i.e. from the bit line to the source line coupled to the selected bit cell) to write a "0" to the selected bit cell. If the data bit to be written (e.g. D0) is high (i.e. 1) and the complementary data bit to be written (e.g. D0*) is low (i.e. 0), then the source line driver circuit (e.g. source line driver 0 38) receiving the data bit will couple the selected source line (e.g. SSL0) to receive a non-ground write voltage or write current and the bit line driver circuit (e.g. bit line driver 0 36) receiving the complementary data bit will couple the selected bit line (e.g. SBL0) to ground during a write operation to a memory cell of array 12. In this manner, the current will flow in a second and opposite direction (i.e. from the source line to the bit line coupled to the selected bit cell) to write a "1" to the selected bit cell.

Figure 2:
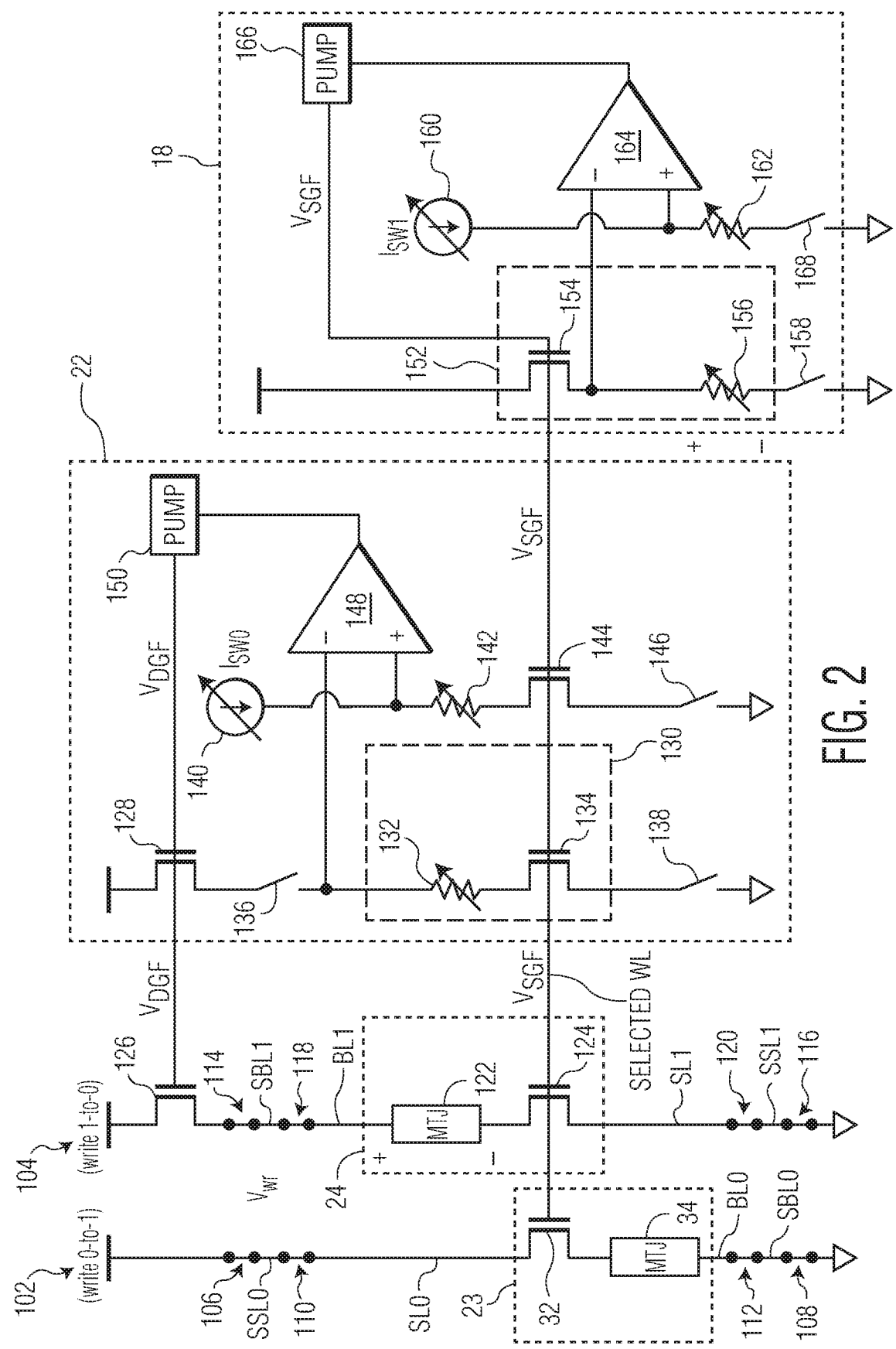
FIG. 2 is a circuit diagram of a select gate regulator circuit and driver gate regulator circuit coupled to two example columns of the non-volatile memory circuit of FIG. 1, according to one embodiment of the present invention.
Figure 3:
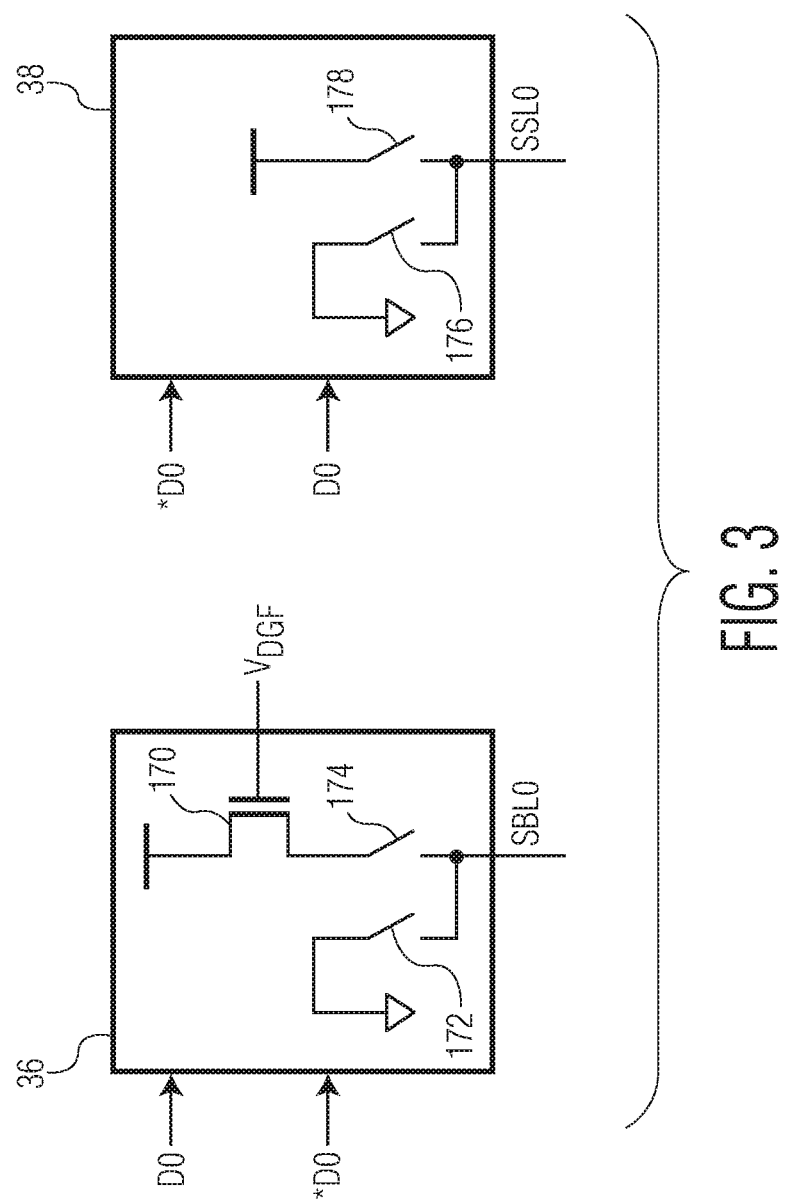
FIG. 3 is a circuit diagram of a bit line driver circuit and a source line driver circuit, according to one embodiment of the present invention.

FIG. 3 illustrates one example of source line driver 0 circuit 38 and a bit line driver 0 circuit 36. Referring first to bit line driver circuit 0 36, if D0 is a "1", then *D0 is a "0". In this case, in bit line driver 0 circuit 36, switch 172 is closed and switch 174 Is open, such that SBL0 is coupled to ground. For source line driver 0 circuit 38, switch 176 is open and switch 178 is closed such that SSL0 is coupled to receive a non-ground write voltage as provided by VDD in the illustrated example. On the other hand, if D0 is a "0", then *D1 is a "1". In this case, in bit line driver 0 circuit 36, switch 172 is open and switch 174 is closed, such that SBL0 is coupled to a non-ground write voltage as provided, in the illustrated example, by a driver transistor 170. As will be described further in reference to FIG. 2, a driver gate follower voltage, $V_{DGF}$, is provided to a gate electrode of transistor 170, in which this voltage is provided by driver gate regulator 22. In an alternate embodiment, as illustrated in FIG. 5, driver transistor 170 of bit line driver 0 circuit 36 is not present such that the non-ground write voltage is provided by VDD. For source line driver 0 circuit, switch 176 is closed and 178 is open, such that SSL0 is coupled to ground. Note that each of the bit line driver circuits 0-K and source line driver circuits 0-K operate in an analogous manner, in which, depending on the values of the corresponding data input, D0-DK, the selected bit line or the selected source line of a selected bit cell is coupled to ground while the other of the selected bit line or the selected source line of the selected bit cell is coupled to a non-ground write voltage.

FIG. 2 illustrates, in partial block diagram form and partial schematic form, two example columns of array 12 and an intersecting selected word line (WL), and further details of select gate regulator 18 and driver gate regulator 22, in accordance with one embodiment of the present invention. Columns 102 and 104 represent two example columns of array 12, both of which are intersected by the selected WL, in which the selected WL corresponds to one of WL0-WLM. In the illustrated embodiment, column 102 includes bit cell 23, which, when selected, is coupled to SBL0 and SSL0, and column 104 includes bit cell 24, which, when selected, is coupled to SBL1 and SSL1. However, in an alternate embodiment, columns 102 and 104 can be any two columns of array 12, in which the selected bit line and source line of column 102 may correspond to any one of SBL0-SBLK and corresponding SSL0-SSLK, and the selected bit line and source line of column 104 can be a second one of SBL0-SBLK and corresponding SSL0-SSLK. Note that the bit cells of columns 102 and 104 are connected to the same intersecting selected WL, but need not be adjacent bit cells in array 12.

FIG. 2 illustrates write circuitry for a write to selected bit cells 23 and 24. In the illustrated embodiment, it is assumed that bit cell 23 initially stores a logic level 0 such that MTJ 34 of bit cell 23 is in the LRS, and bit cell 24 initially stores a logic level 1 such that MTJ 122 of bit cell 24 is in the HRS. Upon a write operation to bit cells 23 and 24, the state of each corresponding MTJ will be switched to the opposite state such that bit cell 23 is written to a logic level 1 by placing MTJ 34 into the HRS, and bit cell 24 is written to a logic level 0 by placing MTJ 122 into the LRS. This is done, as described above, by providing current through the corresponding MTJ in the appropriate direction.

Referring first to column 102, bit cell 23 includes select transistor 23 having a first current electrode coupled to SL0 and a second current electrode coupled to a first terminal of MTJ 34. A second terminal of MTJ 34 is coupled to BL0. Closed switch 110 represents the connections in column decoder 116 which couples SL0 to SSL0 when bit cell 23 is addressed for a memory read or write operation, and closed switch 112 represents the connections in column decoder 116 which couples BL0 to SBL0 when bit cell 23 is addressed for the memory read or write operation. Closed switches 106 and 108 represent the connections in source line driver 0 and bit line driver 0, respectively, for a write operation. Since bit cell 23 is being written to a HRS (indicating D0 is a logic level 1), in the current example, source line driver 0 couples SL0 to VDD (i.e. a non-ground voltage that is greater than ground). Therefore, referring to FIG. 3, with D0 being a logic level 1, closed switch 106 represents the state in which switch 176 is open and switch 178 is closed such that SSL0 is coupled to VDD. Also, with D0 being a logic level 1, bit line driver 0 couples BL0 to ground. Therefore, referring to FIG. 3, closed switch 108 represents the state in which switch 172 is closed and switch 174 is open. A gate of select transistor 32 is coupled to the selected WL, which receives $V_{SGF}$ from select gate regulator 18 during a write operation, to be discussed further below.

Referring next to column 104, bit cell 24 includes an MTJ 122 having a first terminal coupled to BL1 and a second terminal coupled to a first current electrode of a select transistor 124. A second current electrode of select transistor 124 is coupled to SL1. A first terminal of a driver transistor 126 is coupled to VDD, a gate electrode of driver transistor 126 is coupled to receive $V_{DGF}$ from driver gate regulator 22, and a second current electrode of driver transistor 126 is coupled to the first terminal of MTJ 122 via closed switches 114 and 118. Closed switch 118 represents the connections in column decoder 116 which couples BL1 to SBL1 when bit cell 24 is addressed for a memory read or write operation, and closed switch 120 represents the connections in column decoder 116 which couples SL1 to SSL1 when bit cell 24 is addressed for the memory read or write operation. Closed switches 114 and 116 represent the connections in bit line driver 1 and source line driver 1, respectively, for a write operation. Since bit cell 24 is being written to a LRS (indicating D0 is a logic level 0), in the current example, source line driver 1 couples SL1 to VDD (i.e. a non-ground voltage that is greater than ground). Therefore, referring to FIG. 3 in which the circuitry of source line driver 1 is analogous to source line driver 0, closed switch 106 represents the state in which switch 176 is closed and switch 178 is open such that SSL1 is coupled to ground. Bit line driver 1 is analogous to bit line driver 0 of FIG. 3, therefore, closed switch 114 represents the state in which switch 174 is closed and switch 172 is open. Note that the driver transistor of bit line driver 1 (analogous to driver transistor 170 of bit line driver 0) is the same transistor as driver transistor 126 illustrated in FIG. 2, but repeated in FIG. 3 for better understanding of FIG. 3. A gate of select transistor 124 is coupled to the selected WL, which receives $V_{SGF}$ from select gate regulator 18 during a write operation, to be discussed further below.

During a write operation, as illustrated with the connections represented by closed switches 106, 110, 112, and 108, current is directed through enabled select transistor 23, down through MTJ 24, to ground. During the write operation, as illustrated with the connections represented by closed switches 114, 118, 120, and 116, current is directed from driver transistor 126, down through MTJ 124 and then through enabled select transistor 124 to ground. Note that current is directed in one direction from source line to bit line through MTJ 34, and in an opposite direction, from bit line to source line through MTJ 122. In this manner, bit cell 23 is written to a 1 and bit cell 24 to a 0 during the write operation. The voltages over the MTJs need to be controlled during writes so as not to damage the MTJs. Therefore, select gate regulator 22 regulates the voltage $V_{SGF}$ driven onto the selected WL to enable the select gate for the addressed bit cells, such as select transistors 32 and 124, during the write operation, and driver gate regulator 18 regulates the voltage $V_{DGF}$ provided to the driver transistors of the columns being written to a 1, such as driver transistor 126, during the write operation.

Select gate regulator 18 includes a comparator 164, a charge pump 166, a current source 160, a variable resistor 162, a poly resistor 156 (which may be trimmable), and an NMOS transistor 154. Transistor 154 has a first current electrode coupled to VDD, a control electrode coupled to receive $V_{SGF}$ from pump 166, and a second current electrode coupled to a first terminal of resistor 156 and an inverting input of comparator 164. A second terminal of resistor 156 is coupled via switch 158 to ground. Current source 160 is coupled to the non-inverting input of comparator 164 and to a first terminal of resistor 162. A second terminal of resistor 162 is coupled via switch 168 to ground. Note that during a write operation, switches 158 and 168 are closed such that the second terminals of resistors 156 and 162 are coupled to ground.

Transistor 154 and resistor 156 form a replica circuit 152 of a write path of memory 10 for writing a value to a memory cell in the write path from a LRS to a HRS. In the illustrated embodiment of FIG. 2, replica circuit 152 is a replica of the write path of column 102 which includes bit cell 23 that is written from a LRS (corresponding to a logic level 0) to a HRS (corresponding to a logic level 1). Therefore, transistor 154 is a replica of select transistor 32 and resistor 156 is a replica of the resistance of MTJ 34. Since the MTJs along the selected WL, including MTJ 34, begin in a LRS for the write operation, resistor 156 is set to the LRS resistance as well. By using a poly resistor for resistor 156, the same process, voltage, and temperature variation effects on the MTJs will also affect resistor 156. In this manner, the replica circuit and thus $V_{SGF}$ track the write path parasitics and the temperature coefficient of the MTJs.

During a write operation, current source 160 provides a reference current $I_{SW1}$ down through resistor 162 to ground (via closed switch 168). Current source 160 and resistor 162 form a reference current path for regulator 18. A first input (the inverting input) of comparator 164 is coupled to a first node (the first terminal of resistor 156) of replica circuit 152, and a second input (the non-inverting input) of comparator 164 is coupled to a second node (the first terminal of resistor 162), and an output of comparator 164 provides a digital signal to pump 166 to control the turning on and off (the enabling and disabling, respectively) of pump 166 to increase $V_{SGF}$ or not. Comparator 164 and pump 166 may be referred to as a regulator circuit having inputs coupled to each of write replica circuit 152 and the reference current path.

Current source 160 can be controlled and trimmed so as to set a desired or target voltage over resistor 162 and thus at the non-inverting input of comparator 164. The output of comparator 164 controls pump 166 (by turning it on or off as needed) to provide $V_{SGF}$ to the control electrode of replica select transistor 154 thus regulating the voltage at the inverting input of comparator 164 to match the voltage at the non-inverting input of comparator 164. The voltage at the non-inverting input of comparator 164 determines the voltage at the inverting input and thus the current through replica resistor 156, which is set to replicate the LRS of an MTJ. In this manner, by setting $I_{SW1}$ to a particular current (which may be trimmed per chip through circuit characterization), the target voltage over resistor 162 is set, in which this target voltage also represents the desired or target voltage over the MTJs along the selected WL being transitioned from a LRS to a HRS, such as MTJ 34. This target voltage over these MTJs, which start in the LRS, results in the desired or target programming current through these MTJs from the corresponding source line to the corresponding bit line for the write operation.

Therefore, by controlling the voltage, $V_{SGF}$, on the control electrode of transistor 154 and the selected WL (selected by row decoder 14), the voltage over replica resistor 156 matches the target voltage over resistor 162, and this target voltage over replica resistor 156 is transported to the first terminals of the MTJs on the selected WL, including MTJ 34, which are transitioning from the LRS to the HRS. Referring to the example bit cell 23 of FIG. 2, since resistor 156 is set to replicate the LRS (i.e. the initial state) of MTJ 34, the current through MTJ 34 for programming is limited or controlled by regulator circuit 18 to be optimized for a write to the HRS so that only the necessary current is used and MTJ 34 is not over-exposed to a higher current. Also, with replica resistor 156 implemented as a trimmable poly resistor, the resistance of resistor 156 can be trimmed for the process and temperature effects of MTJ 34, which allows for the programming current through MTJ 34 to be optimized across process and temperature variations.

Note that in this scenario of writing a "1" to bit cell 23 (i.e. changing bit cell 23 from the LRS to the HRS), in which MTJ 34 is situated between select transistor 32 and ground, select transistor 32 operates as a source follower to control the voltage over MTJ 34 in response to $V_{SGF}$ and thus control the current through MTJ 34 during the write. That is, select transistor 32 operates as a source follower to regulate the voltage at the first terminal of MTJ 34, in which the first terminal of MTJ 34 is at a higher write voltage than the second terminal of MTJ 34 during the write operation. Furthermore, the select transistor corresponding to each MTJ along the selected WL being transitioned from the LRS to the HRS operates as a source follower which, in response to $V_{SGF}$, regulates the voltage at the first terminals of MTJs which are coupled between the corresponding select transistors and ground such that the first terminals of these MTJs 34 is at a higher write voltage than the corresponding second terminals of these MTJs during the write operation Driver gate regulator 22 includes a comparator 148, a charge pump 150, a current source 140, a variable resistor 142, a poly resistor 132 (which may be trimmable), and NMOS transistors 128, 134, and 144. Driver transistor 128 has a first current electrode coupled to VDD, a control electrode coupled to receive $V_{DGF}$ from pump 150, and a second current electrode coupled, via a switch 136, to a first terminal of resistor 132 and an inverting input of comparator 148. A second terminal of resistor 132 is coupled to a first current electrode of transistor 134. Transistor 134 has a control electrode coupled to receive $V_{SGF}$ from source gate regulator 18 and a second current electrode coupled via switch 138 to ground. Current source 140 is coupled to the non-inverting input of comparator 148 and to a first terminal of resistor 142. A second terminal of resistor 142 is coupled to a first current electrode of transistor 144. A control electrode of transistor 144 is coupled to receive $V_{SGF}$ from source gate regulator 18, and a second current electrode of transistor 144 is coupled to ground via switch 146 Note that during a write operation, switches 136, 138, and 146 are closed such that the second current electrode of transistor 128 is coupled to the first terminal of resistor 132 and the inverting input of comparator 148, and the second current electrodes of transistors 134 and 144 are coupled to ground.

Transistor 134 and resistor 132 form a replica circuit 132 of a write path of memory 10 for writing a value to a memory cell in the write path from a HRS to a LRS. In the illustrated embodiment of FIG. 2, replica circuit 152 is a replica of the write path of column 104 which includes bit cell 24 that is written from a HRS (corresponding to a logic level 1) to a LRS (corresponding to a logic level 0). Therefore, transistor 134 is a replica of select transistor 124 and thus also receives $V_{SGF}$ at its control electrode and resistor 132 is a replica of the resistance of MTJ 122. Also, transistor 128 is a replica of driver transistor 126 of column 104. Since the MTJs along the selected WL, including MTJ 122, begin in a HRS for the write operation, resistor 132 is set to the HRS resistance as well. By using a trimmable poly resistor for resistor 132, the resistance of resistor 132 can be trimmed for the process and temperature effects of MTJ 122. In this manner, the replica circuit and thus $V_{DGF}$ track the write path parasitics and the temperature coefficient of the MTJs.

During a write operation, current source 140 provides a reference current $I_{SW0}$ down through resistor 142 and transistor 144 to ground (via closed switch 146). Transistor 144 is also meant to replicate select transistor 124 of column 104 and therefore also receives $V_{SGF}$ at its control electrode. Current source 140, resistor 142, and transistor 144 form a reference current path for regulator 22. A first input (the inverting input) of comparator 148 is coupled to a first node (the first terminal of resistor 132) of replica circuit 130, and a second input of comparator 148 (the non-inverting input) is coupled to a second node (the first terminal of resistor 142), and an output of comparator 148 provides a digital signal to pump 150 to control the turning on and off (the enabling and disabling, respectively) of pump 150 to increase $V_{DGF}$ or not. Comparator 148 and pump 150 may be referred to as a regulator circuit having inputs coupled to each of write replica circuit 130 and the reference current path. Note that pump 150 increases $V_{DGF}$ such that $V_{DGF}$ may go above VDD which allows more current to be driven by the drive transistors and provide more headroom to the write paths by raising the nodes at the first terminals of MTJ 122 and resistor 132 closer to VDD.

Current source 140 can be controlled and trimmed, similar to current source 160, so as to set a desired voltage at the circuit node located at the first terminal of resistor 142 and thus at the non-inverting input of comparator 148. The output of comparator 148 controls pump 150 (by turning it on or off as needed) to provide $V_{DGF}$ to the control electrode of transistor 128 thus regulating the voltage at the inverting input of comparator 148 to match the voltage at the non-inverting input of comparator 148. The voltage at the non-inverting input of comparator 148 determines the voltage at the inverting input and thus the current through replica resistor 132, which is set to replicate the LRS of an MTJ. In this manner, by setting $I_{SW0}$ to a particular current (which may be trimmed per chip through circuit characterization), the target voltage at the first terminal of resistor 142 is set, in which this target voltage also represents the desired or target voltage at the first terminals of the MTJs along the selected WL being transitioned from a HRS to a LRS, such as MTJ 122. (Note that voltage at the first terminals of the MTJs along the selected WL represent the bit line voltages of these MTJs along the selected WL.) This target voltage at the first terminals of these MTJs, which start in the HRS, results in the desired or target programming current through these MTJs from the corresponding bit line to the corresponding source line for the write operation.

Therefore, by controlling the voltage, $V_{DGF}$, on the control electrode of transistor 128, the voltage at the non-inverting input of comparator 148 matches the voltage at the inverting input of comparator 148 (at the first terminal of resistor 132), and this target voltage at the first terminal of resistor 132 is transported to the corresponding first terminals (i.e. bit lines) of the MTJs on the selected WL, including MTJ 122, which are transiting from the HRS to the LRS.

Referring to the example bit cell 24 of FIG. 2, since resistor 132 is set to replicate the HRS (i.e. the initial state) of MTJ 122, and $V_{SGF}$ is provided to the control electrodes of both replica select transistor 134 and select transistor 124, the current through MTJ 122 for programming is limited or controlled by regulator circuit 22 to be optimized for a write to the LRS so that only the necessary current is used and MTJ 122 is not over-exposed to a higher current.

Note that in this scenario of writing a "0" to bit cell 24, in which MTJ 34 is situated between driver transistor 126 and select transistor 124, select transistor 32 operates as a switch to couple the second terminal MTJ 122 to SL1 (and thus to ground) and does not operate as a source follower. This applies to the corresponding select transistor for each MTJ along the selected word line. Also, in the illustrated embodiment of FIG. 2, only column 104 includes a driver transistor in the write path. However, in alternate embodiments, a driver transistor may also be present in the write path of column 102, situated between VDD and closed switch 106. In this embodiment, regulator circuit 18 would also include a replica driver transistor (similar to replica driver transistor 128 in regulator 22) located between VDD and replica select transistor 154. This additional replica driver transistor would also receive $V_{DGF}$ at its control electrode during a write operation.

Therefore, in one embodiment, through the use of select gate regulator 18 to regulate the voltage on the selected word line, transitions from a LRS to a HRS on addressed bit cells can be optimized and controlled to provide the correct level of programming current across temperature, process, and voltage. Also, through the use of driver gate regulator 22 to regulate the voltage provided to the driver transistors, transitions from a HRS to a LRS on addressed bit cells can also be optimized and controlled to provide the correct level of programming current across temperature, process, and voltage. Therefore, the write bias voltages $V_{SGF}$ and $V_{DGF}$ properly track write path parasitics as well as the temperature coefficients of the MTJs to provide the correct level of current across all corners. In one embodiment, both select gate regulator 18 and driver gate regulator 22 are enabled during write operations to simultaneously optimize write transitions from LRS to HRS and from HRS to LRS for MTJs along the selected WL to provide the correct programming currents.

Figure 4:
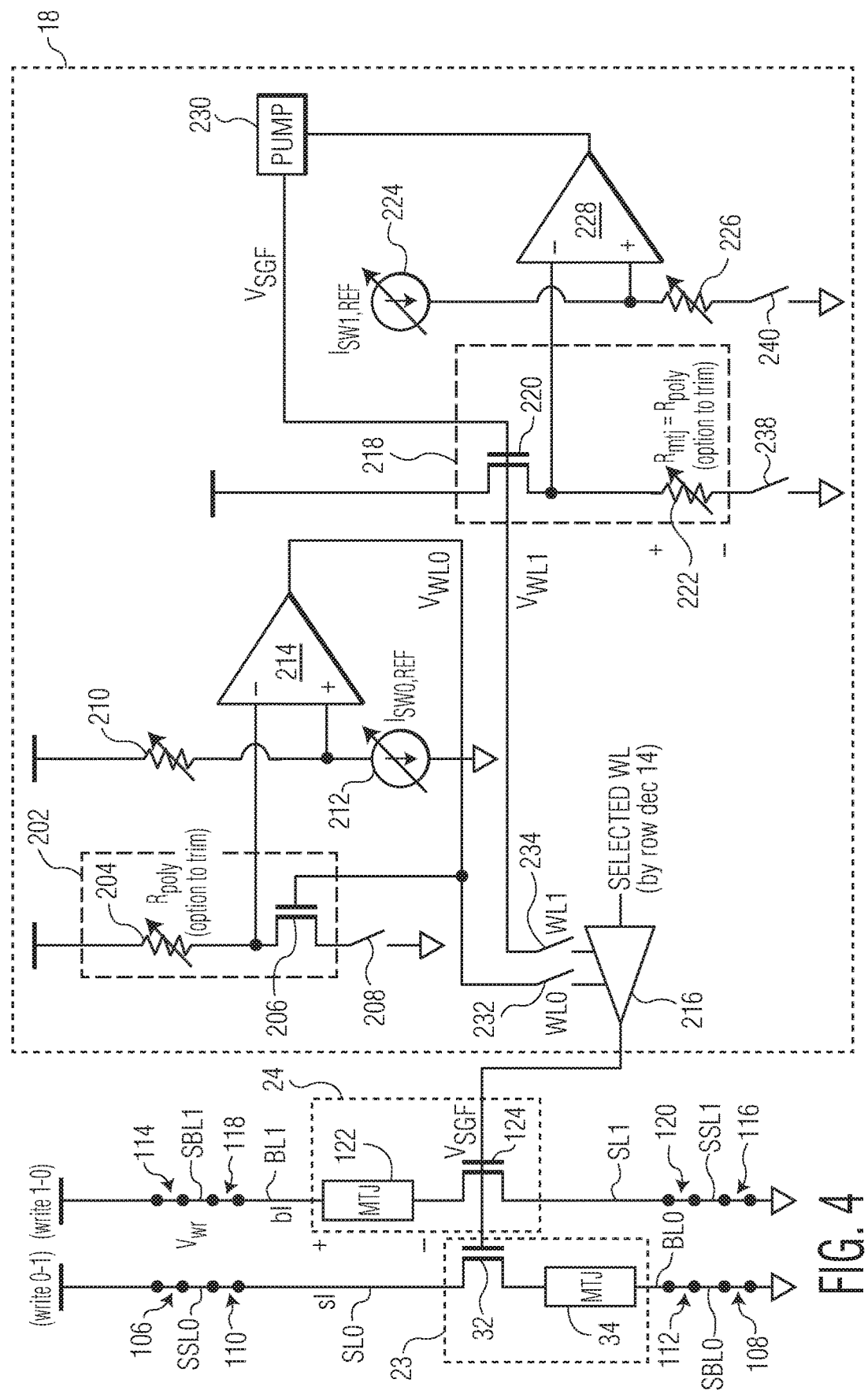
FIG. 4 is a circuit diagram of a select gate regulator circuit coupled to two example columns of the non-volatile memory circuit of FIG. 1, according to one embodiment of the present invention.

FIG. 4 illustrates an alternate configuration for select gate regulator 18 which regulates a voltage on the selected WL, $V_{SGF}$, to optimize writing from a first resistive state to a second and different resistive state (by setting the desired programming currents), in which $V_{SGF}$ is set to a first voltage level using a first portion of select gate regulator 18 for writing from a LRS to a HRS, and subsequently, set to a second voltage level using a second portion of select gate regulator 18 for writing from the HRS to the LRS. Therefore, while the embodiment of FIG. 2 provides increased write speeds as compared to the embodiment of FIG. 4, since the writes from LRS to HRS and the writes from HRS to LRS can be performed simultaneously, the embodiment of FIG. 4 is smaller in size, having, for example, only one charge pump and fewer driver transistors.

Referring to FIG. 4, columns 102 and 104 are the same as illustrated and described in reference to FIG. 2, except that column 104 (like column 102) also does not include a driver transistor. Note also that with the embodiment of FIG. 4, each bit line driver circuit 0-K may be implemented as illustrated in FIG. 5 for bit line driver 0 36, as was described above, in which no driver transistor 170 is present, as compared to the embodiment of bit line driver 0 36 in FIG. 3.

Select gate regulator 18 includes a buffer 216 which is coupled to receive the selected WL (selected by row decoder 14), and provides $V_{SGF}$ as an output to the control electrodes of the select transistors of the selected bit cells (e.g. select transistors 32 and 124) during a write operation. During this write operation, it is assumed that 0s are written first and then 1s. However, this may be reversed such that 1s are written before writing the 0s. In one embodiment, the timing of the writes of 0s versus the writes of 1s is controlled by controller 20. In this embodiment, controller 20 provides a control signals W0 and W1 to select gate regulators circuits 0-K, in which W0 is asserted (and W1 is negated) when writes of 0s is being performed during the write operation and W1 is asserted (and W0 is negated) when writes of 1s is being performed. Therefore, when W1 is asserted, buffer 216 drives $V_{SGF}$ to a first voltage level $V_{WL1}$ to optimize the writes from LRS to HRS by controlling the programming currents, and when W0 is asserted, buffer 216 drives $V_{SGF}$ to a second voltage level $V_{WL0}$ to optimize the writes from HRS to LRS by controlling the programming currents. Note that only one of W0 and W1 can be asserted at a particular time.

Referring first to the part of the operation which performs the writes from LRS to HRS, or the writes of 1s, a first portion of select gate regulator 18 provides $V_{WL1}$ to buffer 216. This first portion includes a replica circuit 218 includes a replica select gate transistor 220 and a replica resistor 222, a reference current path which includes a current source 224 and a resistor 226, a comparator 228, and a charge pump 230. Note that operation of this first portion of select gate regulator 18 is analogous to the description of the embodiment of select gate regulator circuit provided in reference to FIG. 2. That is, the descriptions of replica circuit 218 (including replica select gate transistor 220 and replica resistor 222), the reference current path (including current source 224 and resistor 226), comparator 228, and charge pump 230 are analogous to the descriptions of replica circuit 152 (including replica select gate transistor 154 and replica resistor 156), the reference current path (including current source 160 and resistor 162), comparator 164, and charge pump 166. Therefore, all the descriptions provided above with respect to these elements of FIG. 2 apply to the analogous elements of FIG. 4, in which, in FIG. 2, $V_{SGF}$ is the same as $V_{WL1}$, which is provided to the control electrode of the select gates. In this manner, the select gates corresponding to the MTJs along the selected WL transitioning from LRS to HRS, including select gate 32, operate as source followers to regulate the voltage over each of these MTJs to obtain the desired programming current across variations in process, voltage, and temperature. Note that switches 238, coupled between resistor 22 and ground, and switch 240, coupled between resistor 226 and ground, are closed during the write 1s portion of the write operation and open otherwise.

Referring next to the part of the operation which performs the writes from HRS to LRS, or the writes of 0s, a second portion of select gate regulator 18 provides $V_{WL0}$ to buffer 216. This second portion includes a resistor 204, a transistor 206, a current source 212, a resistor 210, a voltage regulator 214 (also referred to as a regulator circuit), and a switch 208. A first terminal of resistor 204 is coupled to VDD, and a second terminal of resistor 204 is coupled to a first current electrode of transistor 206 and to a non-inverting input of voltage regulator 214. A second current electrode of transistor 206 is coupled to ground via switch 208. Note that switch 208 is closed during the write 0s portion of the write operation and open otherwise. A first terminal of resistor 210 is coupled to VDD and a second terminal of resistor 210 is coupled to current source 212 and an inverting input of voltage regulator 214. Current source 212 is coupled between the second terminal of resistor 210 and ground. An output of voltage regulator 214 is coupled to provide $V_{WL0}$ to a control electrode of transistor 206 and to buffer 216. Note that this second portion of select gate regulator 18, unlike the first portion, does not include a charge pump between the output of the voltage regulator 214 and buffer 216, and operates as a regulator to regulate $V_{WL0}$.

This second portion of select gate regulator 18 works similar to the first portion. Resistor 204 and transistor 206 form a replica circuit 202 which replicates the write path of column 104. Since MTJ 122 is initially in the HRS, resistor 204 is also set to the HRS. Resistor 204 is also implemented as a poly transistor to mirror the effects of voltage, process, and temperature variation on the MTJs. A reference current $I_{SW0}$ is set so as to achieve a desired or target voltage at the second terminal of resistor 210. By way of output $V_{WL0}$ provided to replica select gate 206, the voltage at the second terminal of resistor 204, and thus the non-inverting input of voltage regulator 214) is regulated to match the target voltage at the second terminal of resistor 210. Note that the output of voltage regulator 214 is directly coupled to the control electrode of transistor 206 and not via a charge pump, since it is not necessary to increase the output voltage of voltage regulator 214 above VDD. Since $V_{WL0}$ is provided as $V_{SGF}$ to all select gates coupled to the selected WL, including select gates 124 and 32, the target voltage is transported to the second terminals of the MTJs along the selected WL which are transitioning from HRS to LRS, including MTJ 122, which operates to control the voltage over these MTJs 122 to obtain the desired programming current across variations in process, voltage, and temperature.

Therefore, by now it can be appreciated how the programming current for a LRS to HRS transition of a first set of selected MTJs along a selected WL can be optimized by using the corresponding select transistors as source followers to regulate the voltage over each corresponding MTJ of the first set in response to the output of a voltage regulator circuit which is coupled to both a replica write path for an MTJ in the LRS and a reference current path. In one embodiment, the programming current for the LRS to HRS transitions of the first set of selected MTJs is optimized along with the optimization of the programming current for a HRS to LRS transition of a second set of selected MTJs along the selected WL by controlling the gate voltage on a corresponding driver transistor of each write path containing a corresponding MTJ of the second set of selected MTJs by a voltage regulator circuit which is coupled to a replica write path for an MTJ in the HRS and a reference circuit path. The replica write path circuits of each voltage regulator circuit is implemented with a poly resistor to replicate the LRS or the HRS such that the outputs of the regulator circuits properly set the desired programming currents across variations in voltage, process, and temperature.

In another embodiment, the write currents can be optimized separately in time for the LRS to HRS and the HRS to LRS transitions of the MTJs along a selected WL. In this case, for the LRS to HRS transition for the first set of MTJs along the selected WL can be performed with a first regulator circuit while the HRS to LRS transition for a second set of MTJs along the selected WL can be performed either before or after the LRS to HRS transitions for the first set of MTJs by a second regulator circuit. In this embodiment, the first regulator circuit provides an output voltage applied to the select gates corresponding the first set of MTJs along the selected WL in which these select gates are used as source followers to regulate the voltage over the MTJs of the first set of MTJs, similar to the embodiment of the previous paragraph. The second regulator circuit provides an output voltage applied to the select gates corresponding the second set of MTJs along the selected WL to regulate the corresponding bit line voltages in which these select gates act as switches rather than source followers. Similarly to the previous embodiment, each voltage regulator circuit includes inputs coupled to a replica write path circuit and to a reference current path to provide the corresponding output, in which the replica write path circuits include a poly resistor to replicate the LRS or the HRS of an MTJ such that the outputs of the regulator circuits properly set the desired programming currents across variations in voltage, process, and temperature.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) preceding or following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a memory includes a memory array of resistive memory cells, each resistive memory cell of the array including a select transistor and resistive memory element for storing a value; a row decoder, the row decoder providing a plurality of word lines, wherein each select transistor of a resistive memory cell of the of the memory array is coupled to a word line of the plurality; and a word line regulator for providing a write word line voltage for an asserted word line during a write operation. The word line regulator includes write replica circuit, the write replica circuit being a replica of a write path of the memory for writing a value to a memory cell in the write path from a low resistance value to a high resistance value of the resistive memory element of the memory cell; a reference current path including a reference current source; and a regulator circuit including a first input coupled to a first node of the write replica circuit, a second input coupled to a second node of the reference current path, and an output to provide the write word line voltage. The word line regulator regulates the write word line voltage at a value during a write operation to a memory cell being written from a low resistance value to a high resistance value such that the select transistor of the memory cell is used as a source follower to regulate a first node of a resistive element of the memory cell being written wherein the first node is at a higher write voltage than a second node of the resistive element during the write operation, wherein the first node is located in a write path between the select transistor and the second node of the resistive element of the memory cell. In one aspect of this embodiment, the memory further includes a second write replica circuit being a replica of a write path of the memory for writing a value to a memory cell in the write path from a high resistance value to a low resistance value of a resistive memory element of a memory cell during a write operation. In a further aspect, the write replica circuit includes a first resistive circuit having a first resistance value and the second write replica circuit includes second resistive circuit having a second resistance value different than the first resistance value. In yet a further aspect, the first resistance value matches a low resistance storage value of a resistive element of a memory cell of the array and the second resistance value matches a high resistance storage value of a resistive element of a memory cell of the array. In another yet further aspect, each of the write replica circuit and the second write replica circuit includes a replica selective transistor wherein the first resistive circuit is located in the write replica path between a low supply terminal and the replica selective transistor of the write replica circuit and the second resistive circuit is located in the second write replica path between the high supply terminal and the replica selective transistor of the second write replica path. In another further aspect, the second write replica circuit includes a replica select transistor whose control electrode voltage is controlled by the output of the regulator circuit during a write operation to a memory cell of the array. In another further aspect, the memory further includes a second reference current path including a second reference current source; and a second regulator circuit including a third input coupled to a third node of the second write replica circuit, a fourth input coupled to a fourth node of the second reference current path, and a second output to provide a regulated voltage during a write operation. In yet a further aspect, the regulated voltage is provided to a control electrode of a write driver transistor of a second write path to write to a memory cell of the array being written from a high resistance value to a low resistance value during a write operation to the memory cell of the array. In another yet further aspect, the word line regulator utilizes the regulated voltage to regulate the write word line voltage at a value during a write operation to a memory cell being written from a high resistance value to a low resistance value. In yet an even further aspect, the word line regulator utilizes the regulated voltage to regulate the write word line voltage at a value during a write operation to a memory cell being written from a high resistance value to a low resistance value by controlling the current of a second write path used to write to the memory cell during the write operation. In another yet even further aspect, the regulator circuit includes charge pump for providing the word line voltage during a write operation to a memory cell being written from a low resistance value to a high resistance value during a write operation, wherein the second regulator circuit does not include a charge pump. In another aspect of this embodiment, the write replica circuit includes a first resistive circuit having a first resistance value and the reference current path includes second resistive circuit having a resistance value that matches the first resistance value In another embodiment, memory includes a memory array of resistive memory cells, each resistive memory cell of the array including a select transistor and resistive memory element for storing a value; a row decoder, the row decoder providing a plurality of word lines, wherein each select transistor of a resistive memory cell of the of the memory array is coupled to a word line of the plurality; a first write replica circuit, the first write replica circuit being a replica of a write path of the memory for writing a value to a memory cell in the write path from a low resistance value to a high resistance value of the resistive memory element of the memory cell; a second write replica circuit, the second write replica circuit being a replica of a write path of the memory for writing a value to a memory cell in the write path from a high resistance value to a low resistance value of the resistive memory element of the memory cell; a first regulator circuit including a first input coupled to a first node of the first write replica circuit, and an output to provide a first regulated voltage; and a second regulator circuit including a second input coupled to a second node of the second write replica circuit, and an output to provide a second regulated voltage. The first regulated voltage is provided to a control electrode of a first transistor in a first write path for writing a value to a memory cell in the first write path from a low resistance value to a high resistance value of the resistive memory element of the memory cell and wherein the second regulated voltage is provided to a control electrode of a second transistor in a second write path for writing a value to a memory cell in the second write path from a high resistance value to a low resistance value of the resistive memory element of the memory cell. In one aspect of this another embodiment, the first write replica circuit includes a first resistive circuit having a first resistance value and the second write replica circuit includes second resistive circuit having a second resistance value different than the first resistance value. In a further aspect, the second resistance value is greater than the first resistance value. In another aspect, the second write replica circuit includes a replica select transistor whose control electrode voltage is controlled by the output of the first regulator circuit during a write operation to a memory cell of the array. In yet an other aspect, the memory further includes a first reference current path including a first reference current source; and a second reference current path including a second reference current source, wherein the first regulator circuit includes a third input coupled to a third node of the first reference current path, and the second regulator circuit includes a fourth input coupled to a fourth node of the second reference current path. In yet another aspect, the first transistor in the first write path is a select transistor of a memory cell being written to during a write operation.

In yet another embodiment, a memory includes a memory array of resistive memory cells, each resistive memory cell of the array including a select transistor and resistive memory element for storing a value; a row decoder, the row decoder providing a plurality of word lines, wherein each select transistor of a resistive memory cell of the of the memory array is coupled to a word line of the plurality; and a word line regulator for providing a write word line voltage for an asserted word line during a write operation. The word line regulator includes a first write replica circuit, the first write replica circuit being a replica of a write path of the memory for writing a value to a memory cell in the write path from a low resistance value to a high resistance value of the resistive memory element of the memory cell; a second write replica circuit, the second write replica circuit being a replica of a write path of the memory for writing a value to a memory cell in the write path from a high resistance value to a low resistance value of the resistive memory element of the memory cell; a first regulator circuit including a first input coupled to a first node of the first write replica circuit, and an output to provide a first regulated voltage; and a second regulator circuit including a second input coupled to a second node of the second write replica circuit, and an output to provide a second regulated voltage. The word line regulator provides the first regulated voltage as a write word line voltage during a write operation to a memory cell being written from a low resistance value to a high resistance and provides the second regulated voltage as a write word line voltage during a write operation to a memory cell being written from a high resistance value to a low resistance value. In one aspect of this yet another embodiment, the first regulator circuit includes a charge pump and the second regulator circuit does not include a charge pump.

What is claimed is:

1. A memory comprising:
   a memory array of resistive memory cells, each resistive memory cell of the array including a select transistor and resistive memory element for storing a value;
   a row decoder, the row decoder providing a plurality of word lines, wherein each select transistor of a resistive memory cell of the of the memory array is coupled to a word line of the plurality;
   a word line regulator for providing a write word line voltage for an asserted word line during a write operation, wherein the word line regulator includes:
   write replica circuit, the write replica circuit being a replica of a write path of the memory for writing a value to a memory cell in the write path from a low resistance value to a high resistance value of the resistive memory element of the memory cell;
   a reference current path including a reference current source;
   a regulator circuit including a first input coupled to a first node of the write replica circuit, a second input coupled to a second node of the reference current path, and an output to provide the write word line voltage;
   wherein the word line regulator regulates the write word line voltage at a value during a write operation to a memory cell being written from a low resistance value to a high resistance value such that the select transistor of the memory cell is used as a source follower to regulate a first node of a resistive element of the memory cell being written wherein the first node is at a higher write voltage than a second node of the resistive element during the write operation, wherein the first node is located in a write path between the select transistor and the second node of the resistive element of the memory cell.

2. The memory of claim 1, wherein the memory further includes a second write replica circuit being a replica of a write path of the memory for writing a value to a memory cell in the write path from a high resistance value to a low resistance value of a resistive memory element of a memory cell during a write operation.

3. The memory of claim 2 wherein the write replica circuit includes a first resistive circuit having a first resistance value and the second write replica circuit includes second resistive circuit having a second resistance value different than the first resistance value.

4. The memory of claim 3 wherein the first resistance value matches a low resistance storage value of a resistive element of a memory cell of the array and the second resistance value matches a high resistance storage value of a resistive element of a memory cell of the array.

5. The memory of claim 3 wherein each of the write replica circuit and the second write replica circuit includes a replica selective transistor wherein the first resistive circuit is located in the write replica path between a low supply terminal and the replica selective transistor of the write replica circuit and the second resistive circuit is located in the second write replica path between the high supply terminal and the replica selective transistor of the second write replica path.

6. The memory of claim 2 wherein the second write replica circuit includes a replica select transistor whose control electrode voltage is controlled by the output of the regulator circuit during a write operation to a memory cell of the array.

7. The memory of claim 2 further comprising:
a second reference current path including a second reference current source;
a second regulator circuit including a third input coupled to a third node of the second write replica circuit, a fourth input coupled to a fourth node of the second reference current path, and a second output to provide a regulated voltage during a write operation.

8. The memory of claim 7 wherein the regulated voltage is provided to a control electrode of a write driver transistor of a second write path to write to a memory cell of the array being written from a high resistance value to a low resistance value during a write operation to the memory cell of the array.

9. The memory of claim 7 wherein the word line regulator utilizes the regulated voltage to regulate the write word line voltage at a value during a write operation to a memory cell being written from a high resistance value to a low resistance value.

10. The memory of claim 9 wherein the word line regulator utilizes the regulated voltage to regulate the write word line voltage at a value during a write operation to a memory cell being written from a high resistance value to a low resistance value by controlling the current of a second write path used to write to the memory cell during the write operation.

11. The memory of claim 9 wherein the regulator circuit includes charge pump for providing the word line voltage during a write operation to a memory cell being written from a low resistance value to a high resistance value during a write operation, wherein the second regulator circuit does not include a charge pump.

12. The memory of claim 1 wherein the write replica circuit includes a first resistive circuit having a first resistance value and the reference current path includes second resistive circuit having a resistance value that matches the first resistance value.

13. A memory comprising:
a memory array of resistive memory cells, each resistive memory cell of the array including a select transistor and resistive memory element for storing a value;
a row decoder, the row decoder providing a plurality of word lines, wherein each select transistor of a resistive memory cell of the of the memory array is coupled to a word line of the plurality;
a first write replica circuit, the first write replica circuit being a replica of a write path of the memory for writing a value to a memory cell in the write path from a low resistance value to a high resistance value of the resistive memory element of the memory cell;
a second write replica circuit, the second write replica circuit being a replica of a write path of the memory for writing a value to a memory cell in the write path from a high resistance value to a low resistance value of the resistive memory element of the memory cell;

a first regulator circuit including a first input coupled to a first node of the first write replica circuit, and an output to provide a first regulated voltage;
a second regulator circuit including a second input coupled to a second node of the second write replica circuit, and an output to provide a second regulated voltage;
wherein the first regulated voltage is provided to a control electrode of a first transistor in a first write path for writing a value to a memory cell in the first write path from a low resistance value to a high resistance value of the resistive memory element of the memory cell and wherein the second regulated voltage is provided to a control electrode of a second transistor in a second write path for writing a value to a memory cell in the second write path from a high resistance value to a low resistance value of the resistive memory element of the memory cell.

14. The memory of claim 13 wherein the first write replica circuit includes a first resistive circuit having a first resistance value and the second write replica circuit includes second resistive circuit having a second resistance value different than the first resistance value.

15. The memory of claim 14 wherein the second resistance value is greater than the first resistance value.

16. The memory of claim 13 wherein the second write replica circuit includes a replica select transistor whose control electrode voltage is controlled by the output of the first regulator circuit during a write operation to a memory cell of the array.

17. The memory of claim 13 wherein the memory further comprises:
a first reference current path including a first reference current source;
a second reference current path including a second reference current source;
wherein the first regulator circuit includes a third input coupled to a third node of the first reference current path;
wherein the second regulator circuit includes a fourth input coupled to a fourth node of the second reference current path.

18. The memory of claim 13 wherein the first transistor in the first write path is a select transistor of a memory cell being written to during a write operation.

19. A memory comprising:
a memory array of resistive memory cells, each resistive memory cell of the array including a select transistor and resistive memory element for storing a value;
a row decoder, the row decoder providing a plurality of word lines, wherein each select transistor of a resistive memory cell of the of the memory array is coupled to a word line of the plurality;
a word line regulator for providing a write word line voltage for an asserted word line during a write operation, wherein the word line regulator includes:
a first write replica circuit, the first write replica circuit being a replica of a write path of the memory for writing a value to a memory cell in the write path from a low resistance value to a high resistance value of the resistive memory element of the memory cell;
a second write replica circuit, the second write replica circuit being a replica of a write path of the memory for writing a value to a memory cell in the write path from a high resistance value to a low resistance value of the resistive memory element of the memory cell;

a first regulator circuit including a first input coupled to a first node of the first write replica circuit, and an output to provide a first regulated voltage;

a second regulator circuit including a second input coupled to a second node of the second write replica circuit, and an output to provide a second regulated voltage;

wherein the word line regulator provides the first regulated voltage as a write word line voltage during a write operation to a memory cell being written from a low resistance value to a high resistance and provides the second regulated voltage as a write word line voltage during a write operation to a memory cell being written from a high resistance value to a low resistance value.

20. The memory of claim 19 wherein the first regulator circuit includes a charge pump and the second regulator circuit does not include a charge pump.

\* \* \* \* \*